United States Patent [19]
Campi

[11] Patent Number: 5,105,301
[45] Date of Patent: Apr. 14, 1992

[54] COUPLED QUANTUM-WELL ELECTRO-OPTICAL MODULATOR

[75] Inventor: Domenico Campi, Turin, Italy

[73] Assignee: CSELT - Centro Studi e Laboratori Telecommunicazioni S.p.A., Turin, Italy

[21] Appl. No.: 450,621

[22] Filed: Dec. 14, 1989

[30] Foreign Application Priority Data

Jan. 26, 1989 [IT] Italy .................. 67045 A/89

[51] Int. Cl.$^5$ .......... G02F 1/03; G02F 1/23; G02F 1/00; H01L 27/12
[52] U.S. Cl. .................... 359/245; 359/248; 359/278; 359/321; 357/4; 357/30
[58] Field of Search ......... 350/355, 356; 357/30 E, 357/4; 359/245, 248, 278, 321, 322

[56] References Cited

U.S. PATENT DOCUMENTS

| | | | |
|---|---|---|---|
| 4,439,782 | 3/1984 | Holonyak, Jr. | 357/4 |
| 4,694,312 | 9/1987 | Yamazaki | 357/4 |
| 4,716,449 | 12/1987 | Miller | 350/356 |
| 4,833,511 | 5/1989 | Sugimoto | 357/4 |

OTHER PUBLICATIONS

D. S. Chemla et al.; "Electroabsorption by Stark effect on room temperature excitons in GaAs/GaAlAs multiple quantum well structures"; Appl. Phys. Lett. 42(10) 15 May 1983 p. 864.

D. A. B. Miller; "Novel Optical Modulators and Bistable Devices using the Self Electro-optic Effect in Semiconductor Quantum Wells"; The Second Int. Conference on Modulated Semiconductors–collected papers Sep. 1985 p. 459.

Primary Examiner—Eugene R. LaRoche
Assistant Examiner—Evelyn A. Lester
Attorney, Agent, or Firm—Herbert Dubno

[57] ABSTRACT

A coupled quantum well electro-optical modulator, whose semiconductor structure is composed of one or of a plurality of successions formed by two layers capable of forming quantum wells, of a barrier layer which separates the two layers and of an intrinsic layer which separates the succession from other possible successions, where in presence of an electric field the absorption threshold of the light radiation shifts towards shorter wavelengths.

2 Claims, 1 Drawing Sheet

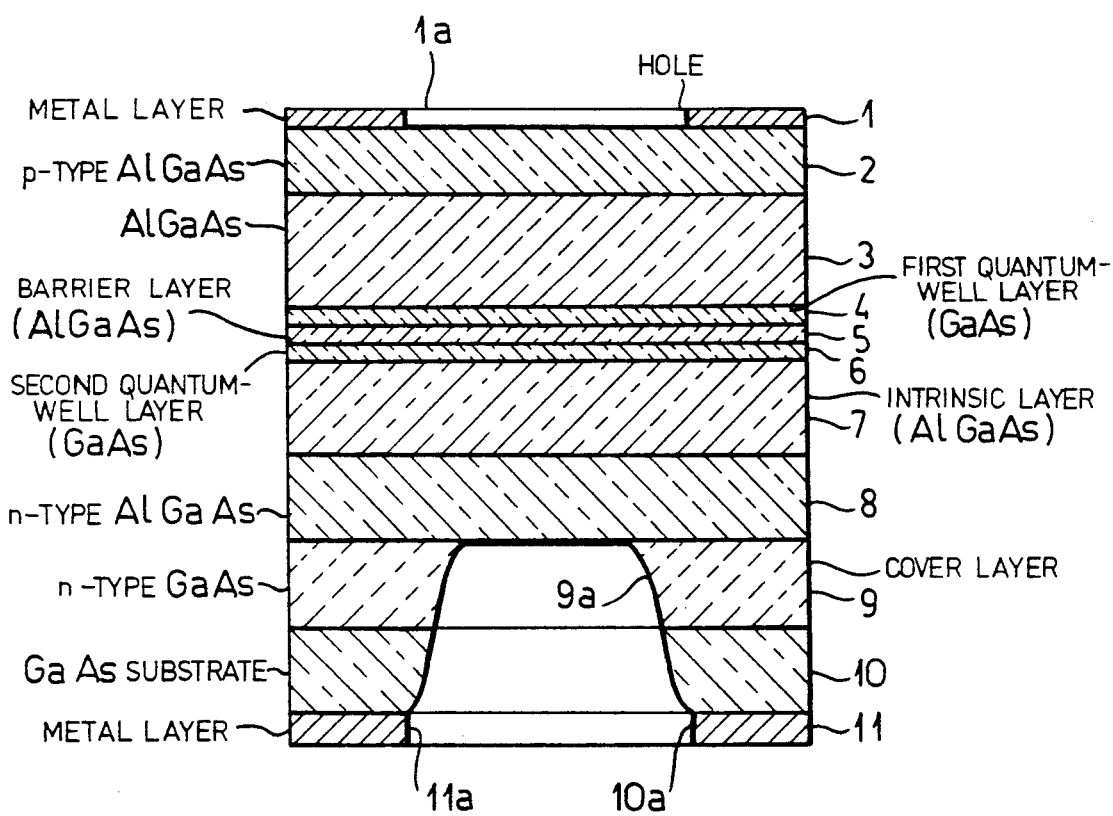

COUPLED QUANTUM-WELL ELECTRO-OPTICAL MODULATOR

FIELD OF THE INVENTION

The present invention relates to telecommunication using light radiation as an information carrier and, more particularly, it to a coupled quantum well electro-optical modulator.

BACKGROUND OF THE INVENTION

As is known, electro-optical modulators are of importance in optical telecommunications systems. They, on the basis of an electrical command, absorb or transmit optical pulses sent from a suitable source, namely a laser, towards their surface. At their output duly coded digital signals can be obtained to be transmitted by optical fibers.

Present-day optical modulators exploit different physical effect, e.g. magneto-optical, acousto-optical and electro-optical effects. The latter effect, more particularly, is used in the so-called "quantum-well" modulators. These devices consist of a succession of layers of semiconductor material, a thin layer of which (having a thickness lower than 250Å) forms the quantum well. The two layers by which it is sandwiched, made of chemically-different semiconductor materials, form the barrier layers.

This arrangement can not as an electro-optical modulator whenever it is incorporated in an electric field perpendicular to the thin layer. To this end the three layers are comprised between semiconductor layers which in turn contact metal layers, to which a suitable potential difference can be applied. The metal layers allow the creation of an electric field, but do not influence the physical phenomenon of absorption or transmission of light radiation, dominated by the thin layer and by the confining barrier layers.

The phenomenon, known as the Stark effect, is an energy level shift induced by an electrical field in the thin layer material. In fact, inside the quantum well there is a set of discrete and quantized levels in the valence band as well as a set of levels in the conduction band. Electron transitions from valence band to conduction band take place by foton absorption with an energy corresponding to an energy level difference. When an electric field is applied, both in the valence band and in the conduction band an energy level shift occurs and consequently, a shift in the light absorption threshold of the device. More particularly, in the known devices the absorption threshold shifts towards lower energy levels, corresponding to longer wavelengths (red shift). Larger shifts can be obtained by using highly-coupled multiple quantum-well structures. Structures consisting of two quantum wells separated by a very thin barrier layer, about 10A thick, are well known (see "Electroabsorption in GaAs/AlGaAs coupled quantum well waveguides", N.M. Islam et al, Applied Physic Lett. 50 (16), 20l Apr. 1987). Absorption threshold shifts towards lower energies are thus obtained which are about ten times greater than those obtainable with a single quantum well. Also the applied electrical field can be lower: about $8.10^4$ V/cm instead of $1.10^5$, which is very near the breakdown voltage of the structure. However, electro-optical modulators whose absorption threshold can be shifted towards higher energy levels, corresponding to shorter wavelengths (blue shift) have not previously been described.

OBJECTS OF THE INVENTION

It is the principal object of the present invention to provide an improved coupled quantum-well electro-optical modulator which can operate with reverse bias and which allows a shift of the light absorption toward higher energy levels with application of an electrical field, thereby increasing the fields of application of such modulators.

Another object of the invention is to provide an improved electro-optical modulator which avoids the drawbacks of the prior art.

SUMMARY OF THE INVENTION

Basically the invention comprises between a p-type layer and an n-type layer one or more layer sandwiches each of which includes a layer forming the first quantum well, an intrinsic barrier layer and a layer forming the second quantum well the layers of the sandwiches having thicknesses such that the structure as a whole has a light-aviation absorption threshold which shifts toward shorter wavelengths when subjected to an electrical field provided between metal layers on the p-type layer and on a substrate to which the n-type layer is applied.

The coupled quantum-well electro-optical modulator, provided by the present invention, allows a shift of the light absorption threshold towards higher-energy levels, with application of an electric field of the order of $10^4$ V/cm. This property offers greater flexibility in optical telecommunications system design, since it allows the designer to use the type of device more suited to the optical radiation source available.

The present invention provides a coupled-quantum well electro-optical modulator consisting of a structure composed of a plurality of semiconductor layers, comprising, a metal layer allowing the structure to be connected to a lead for the application of a control electrical potential.

a p-type layer, an intrinsic layer.

one or more successions comprising, a layer which forms the first quantum well, an intrinsic barrier layer, a second layer which forms the second quantum well, an intrinsic layer.

an n-type layer, an n-type layer covering the substrate.

said substrate, and a metal layer allowing the structure to be connected to a second lead for the application of the control electrical potential, the metal layers, the substrate covering layer and the substrate layer itself having holes to allow the passage of a light radiation sent perpendicular to the structure layers, characterized in that it presents a light radiation absorption threshold which shifts towards shorter wavelengths when it is subjected to the electrical field.

BRIEF DESCRIPTION OF THE DRAWING

The foregoing and other characteristics of the present invention will be made clearer by the following description of a preferred embodiment thereof given by way of non-limiting example, and by the annexed drawing illustrated in annexed drawing, the sole FIGURE of which is a cross sectional view of the modulator structure.

SPECIFIC DESCRIPTION

Modulator performances and, more particularly, the shift of absorption threshold of light radiation towards shorter wavelengths, are obtained by starting from a structure with a conventional layer succession, but using thicknesses both of the thin layers forming quantum wells and of the barrier layer suitably determined to allow blue shift described above.

The drawing shows a section of the coupled quantum-well modulator, with a structure particularly adapted to operate on a light radiation perpendicular to the layers. The thickness of the individual layers is not shown to scale.

The uppermost layer 1 is a metal layer apt to permit structure connection to a lead for the application of a control electrical potential.

Below the layer 1 is a p-type AlGaAs layer 2, about 1 $\mu$m thick, acting as a contact layer.

Beneath the layer 2 is an intrinsic layer with a chemical composition equal to that of layer 2 and with a thickness of about 1 $\mu$m.

The layer below the layer 3 is the first quantum well, layer 4, which is made of GaAs and is 33Å ± 10% thick.

5 The layer 4 operates in a sandwich with a barrier layer 5, made of intrinsic AlGaAs and 33Å ± 10% thick and a layer 6 forming the second quantum well, which is made of GaAs and is 33Å ± 10% thick.

7 This sandwich is followed by an intrinsic layer 7, made of AlGaAs and about 1 $\mu$m thick. This layer, as well as layer 3, are provided to avoid electrical field deformations due to interface electrical fields induced by structure imperfections.

8 denotes an AlGaAs layer the aforedescribed stack is followed by an AlGaAs layer 8; of n-type and about 1 $\mu$m thick, a GaAs layer 9 of n-type and about 3 $\mu$m thick, covering the commercial substrate, which is generally imperfect, and the GaAs substrate 10.

Finally a metal layer 11 is applied to he substrate to allow the structure to be connected to a second lead for application of the control electrical potential.

To allow light radiation passage through layers g and 10 (which are opaque at the operative wavelength) a hole is obtained by selective chemical etching at 9 g, 10 g. Layer S blocks the etching. Of course. even metal layers 1 and 11 have holes in correspondance with the holes 1a, 11a in layers 9 and 10.

It is worth noting that layers 3 and 7 can be replaced by alternate GaAs and AlGaAs layer successions, each being 10Å thick, and with a total thickness of about 0.5 $\mu$m. Such a solution is very expensive, but more efficient in removing undesired electrical field deformations.

All AlGaAs layers present percent compositions equal to 0.3 in Al and 0.7 in Ga.

As is to be noted, the structure is of p-i-n type (doped layer p, intrinsic layer and doped layer n) and for its operation demands a reverse bias voltage, capable of generating an electric field of the order of $10^4$ V/cm.

With previously mentioned quantum well and barrier layer thicknesses two effects are obtained upon creation of the electrical field. A first effect still consists in the shift of the first lowest energy transition towards lower energies (red shift). but this transition becomes extremely inefficient, i.e. it absorbs very little of the light radiation traversing the structure. The second effect consists in the shift of the second transition of higher energy than the preceding one, towards higher energies (blue shift) and in a high efficiency increase. In other words this second transition absorbs very little light radiation when there is no electrical field applied, while it produces an absorption 30 and more times higher in the presence of the electrical field produced by the reverse bias voltage.

Receiving a light radiation with a wavelength corresponding to the first transition energy, the structure is highly absorbing with null electrical-field. Upon application of the electrical field, the first transition undergoes a red shift and becomes less absorbing, while the second transition undergoes a blue shift and becomes extremely absorbing, that is why the structure becomes quasi -perfectly transparent at the light-source wavelength.

To obtain a cumulative effect it is possible to insert in the structure a plurality of quantum wells, of the type of layers 4. 5. G, separated by layers of intrinsic AlGaAs (such as layer 7) of at least 100Å thickness. Thus there is a succession of coupled-well, 100Å of AlGaAs, coupled well. 100Å of AlGaAs,. . . , coupled well. The total thickness of such a succession can attain 0.5 $\mu$m, corresponding to about 30 coupled quantum wells.

The device can operate at a 10 Gbit/s modulation rate on radiation with a wavelength of about 800 nm, whenever the material used in the structure are those previously mentioned. Using different materials, it is possible to operate on radiations with different wavelength: e.g. by replacing AlGaAs with InAlAs, GaAs with InGaAs and GaAs substrate with InP substrate, the operative wavelength attains 1,55 $\mu$m. Since the effect of absorption threshold towards higher energies (blue shift is determined exclusively by the thickness of layer 5 forming the barrier, the material change determines only a change in the wavelengths at which the electro-optic modulator can operate, without perturbing the optical blue shift effect. Finer adjustment of the operative wavelengths can be obtained by changing thickness as of layers 4 and 6, forming the quantum wells.

It is clear that what described has been given only by way of non-limiting example. Variations and modifications are possible without going out of the scope of the invention.

I claim:

1. A reverse-biased coupled quantum well electro-optical modulator consisting of a structure composed of a plurality of semiconductor layers, comprising:
   a first metal layer allowing the structure to be connected to a lead for the application of a control electrical potential,
   a p-type layer in the form of an AlGaAs layer with a thickness of about 1 micrometer below said first metal layer,
   an intrinsic layer in the form of an AlGaAs layer having a thickness of about 1 micrometer below said p-type layer,
   at least one layer sandwich below said intrinsic layer and comprising:
      a first GaAs quantum well layer, and
      an intrinsic AlGaAs barrier layer,
      a second GaAs quantum well layer, and
      a further intrinsic layer of the layer sandwich,
   a first n-type layer in the form of an AlGaAs layer of a thickness of about 3 micrometers below said further intrinsic layer,
   an n-type cover layer below said fist n-type layer,
   a substrate below said cover layer, and a second metal layer allowing the structure to be connected to a second lead of the application of the control electrical potential, said metal layers, said substrate and said cover layer having holes to allow the passage of a light radiation perpendicular to the layers and entirely through all said layers and the modulator, said first and second quantum well layers and said barrier layer, having thicknesses in a range of 33Å±10% so that said layer sandwich presents a light radiation absorption threshold which shifts toward shorter wavelengths in a blue shift when an electrical field of the order of $10^4$V/cm is applied, said modulator absorbing little light radiation in an absence of said electrical field.

2. The coupled quantum well electro-optical modulator defined in claim 1 wherein all of said AlGaAs layers correspond substantially to $Al_{0.3}Ga_{0.7}As$.

* * * * *